(12) United States Patent
Zhang et al.

(10) Patent No.: US 11,476,767 B2
(45) Date of Patent: Oct. 18, 2022

(54) CONSTANT-CURRENT OUTPUT CONTROL CIRCUIT AND ITS DESIGN METHOD

(71) Applicant: LII SEMICONDUCTOR CO., LTD., Suzhou (CN)

(72) Inventors: Jie Zhang, Suzhou (CN); Min Zhu, Suzhou (CN); Fulong Wang, Suzhou (CN)

(73) Assignee: LII SEMICONDUCTOR CO., LTD., Suzhou (CN)

( * ) Notice: Subject to any disclaimer, the term of this patent is extended or adjusted under 35 U.S.C. 154(b) by 20 days.

(21) Appl. No.: 17/266,565

(22) PCT Filed: Oct. 31, 2019

(86) PCT No.: PCT/CN2019/114616
§ 371 (c)(1),
(2) Date: Feb. 5, 2021

(87) PCT Pub. No.: WO2020/074015
PCT Pub. Date: Apr. 16, 2020

(65) Prior Publication Data
US 2021/0296992 A1    Sep. 23, 2021

(30) Foreign Application Priority Data

Oct. 8, 2018  (CN) .......................... 201811168580.X

(51) Int. Cl.
*H02M 3/335* (2006.01)
*H02M 1/00* (2006.01)

(52) U.S. Cl.
CPC ......... *H02M 3/335* (2013.01); *H02M 1/0025* (2021.05); *H02M 1/0009* (2021.05)

(58) Field of Classification Search
CPC . H02M 3/335; H02M 3/33507; H02M 1/0025
See application file for complete search history.

(56) References Cited

U.S. PATENT DOCUMENTS 6,965,223 B1 * 11/2005 MacLean ................ H02M 1/36
                                                                  323/284
7,239,120 B2 *  7/2007 Adragna ............. H02M 1/4225
                                                                  323/299
(Continued)

FOREIGN PATENT DOCUMENTS

CN        101867289 A      10/2010
CN        202276525 U       6/2012
(Continued)

*Primary Examiner* — Gustavo A Rosario-Benitez
(74) *Attorney, Agent, or Firm* — SZDC Law P.C.

(57) ABSTRACT

A constant-current output control circuit includes a control module, a first resistor, a capacitor, and an error amplifier; the control module is connected to an adjustable control voltage and a detection signal, and the non-inverting input end of the error amplifier is connected to the reference voltage, the inverting input end of the error amplifier is connected to the first end of the first resistor, the output end of the error amplifier is connected to the circuit to be connected, and the first end of the capacitor is connected to the first end of the first resistor, the second end of the capacitor is connected to the output end of the error amplifier, and the second end of the first resistor is connected to the control module. The design method of the circuit is also disclosed.

8 Claims, 3 Drawing Sheets

(56) References Cited

U.S. PATENT DOCUMENTS

| | | | |
|---|---|---|---|
| 9,270,176 B1* | 2/2016 | Nguyen | H02M 3/156 |
| 10,250,128 B2* | 4/2019 | Unno | H02M 3/04 |
| 2002/0093321 A1* | 7/2002 | Wrathall | G05F 3/242 |
| | | | 323/282 |
| 2008/0122405 A1 | 5/2008 | Fujikura | |
| 2009/0039853 A1* | 2/2009 | Omi | H02M 3/156 |
| | | | 323/284 |
| 2012/0043946 A1* | 2/2012 | Dong | H02M 3/156 |
| | | | 323/234 |
| 2013/0038313 A1* | 2/2013 | Gotoh | H02M 3/156 |
| | | | 323/288 |
| 2013/0076252 A1* | 3/2013 | Shao | G05F 1/46 |
| | | | 315/186 |
| 2014/0266120 A1* | 9/2014 | Isham | H02M 3/157 |
| | | | 323/283 |
| 2015/0048755 A1* | 2/2015 | Imanaka | H05B 45/382 |
| | | | 363/21.13 |
| 2016/0241145 A1* | 8/2016 | Matsuura | H02M 1/14 |
| 2017/0201175 A1* | 7/2017 | Chen | H02M 3/156 |

FOREIGN PATENT DOCUMENTS

| | | |
|---|---|---|
| CN | 102630114 A | 8/2012 |
| CN | 203801135 U | 8/2014 |
| CN | 109149973 A | 1/2019 |
| CN | 208707546 U | 4/2019 |

* cited by examiner

*Related Art*

CONSTANT-CURRENT OUTPUT CONTROL CIRCUIT AND ITS DESIGN METHOD

This application is a national stage application of PCT/CN2019/114616, filed on Oct. 31, 2019, which claims the benefit of priority from the Chinese patent application No. 201811168580.X, filed on Oct. 8, 2018, and entitled "CONSTANT-CURRENT OUTPUT CONTROL CIRCUIT AND ITS DESIGN METHOD," which is incorporated herein by reference in its entirety.

FIELD OF THE INVENTION

The invention relates to a constant-current output control circuit and its design method, belonging to the field of circuit control.

BACKGROUND OF THE INVENTION

The flyback AC/DC switching mode power supply is widely used in battery chargers, adapters and other fields because of its simple circuit, small size, low cost, and high safety. Although there are various types of flyback AC/DC switching mode power supplies and their internal control modules are becoming more and more complex, all control modules are designed to obtain precise constant-voltage (CV) and constant-current (CC) outputs. For precise constant-voltage output, it can be obtained through dual-loop control of current and voltage feedback. For precise constant-current output, the usual method is to adjust the duty cycle of conduction time of the output rectifier diode. However, in the flyback AC/DC switching mode power supply circuit in the prior art, the circuit output voltage and the reference voltage amplified by the error amplifier will change in different cycles with the change of the circuit output voltage, causing the output current to be not constant.

SUMMARY OF THE INVENTION

The object of the invention is to provide a constant-current output control circuit capable of outputting a constant current and a design method.

In order to achieve the above objectives, the invention provides the following technical solutions: A constant-current output control circuit, the circuit includes a control module, a first resistor, a capacitor, and an error amplifier; the control module is connected to an adjustable control voltage and a detection signal, and the non-inverting input end of the error amplifier is connected to the reference voltage, the inverting input end of the error amplifier is connected to the first end of the first resistor, the output end of the error amplifier is connected to the circuit to be connected, and the first end of the capacitor is connected to the first end of the first resistor, the second end of the capacitor is connected to the output end of the error amplifier, and the second end of the first resistor is connected to the control module.

In an exemplary embodiment, the control module includes a first switch, a second switch and an inverter, and the first end of the first switch is connected to an adjustable control voltage, the second end of the first switch is connected to the second end of the first resistor, the first end of the second switch is grounded, and the second end of the second switch is connected to the second end of the first switch, and the detection signal is connected to the control end of the first switch, and the detection signal is connected to the control end of the second switch after being reversed by the inverter.

In an exemplary embodiment, the adjustable control voltage is the voltage of the circuit output feedback voltage amplified by the error amplifier.

In an exemplary embodiment, when the circuit output feedback voltage changes, the adjustable control voltage changes; When the adjustable control voltage changes, the switching frequency of the constant current output control circuit changes.

In an exemplary embodiment, the voltage value of the reference voltage is smaller than the voltage value of the adjustable control voltage.

In an exemplary embodiment, the output voltage value of the error amplifier is equal to the sum of the reference voltage and the voltage value of the capacitor.

The invention also provides a method for designing a constant-current output control circuit, using the constant current output control circuit as described above, the method includes the following steps:

When the detection signal is low electrical level, the first switch is off and the second switch is on, so that the first resistor generates a first current flowing to the ground, the voltage across the capacitor rises, and the voltage value of the output end of the error amplifier increases;

When the detection signal is high electrical level, the first switch is on and the second switch is off, so that the circuit generates a second current flowing to the capacitor, the voltage across the capacitor drops, and the voltage value of the output end of the error amplifier decreases.

In an exemplary embodiment, the first current flowing to the ground generated by the first resistor is specifically:

The voltage difference between the two ends of the first resistor is $\Delta V_{R1} = V_{REF}$, and when the first current flowing to the ground is generated, the capacitor is charged, the first current is:

$$I_1 = \frac{V_{REF}}{R_1};$$

Wherein, $V_{REF}$ is the reference voltage, and $R_1$ is the first resistor value.

In an exemplary embodiment, the current flowing to the capacitor generated by the circuit is specifically:

The voltage value of the reference voltage is less than the adjustable control voltage value, the voltage difference between the two ends of the first resistor is $\Delta V_{R1} = V_{CST} - V_{REF}$, and a current flowing to the capacitor is generated on the first resistor to discharge the capacitor, the second current is:

$$I_2 = \frac{V_{CST} - V_{REF}}{R1};$$

Wherein, $V_{CST}$ is the adjustable control voltage.

In an exemplary embodiment, the relationship among reference voltage, $V_{CST}$, Tons and $T_{sw}$ is:

$$V_{REF} = V_{CST} \times \frac{\text{Tons}}{T_{sw}};$$

Wherein, Tons is the high electrical level time of the detection signal, and $T_{sw}$ is the period.

The beneficial effect of the invention is: the invention provides a constant-current output control circuit and its design method. The control circuit and method connect a reference voltage at the non-inverting input end of the error amplifier and connect an adjustable control voltage at its inverting input end. Because the access time of the adjustable control voltage is related to the high electrical level time of the detection signal, the ratio of the product of the adjustable control voltage and the high electrical level time of the detection signal to the power switch cycle is the reference voltage; because the reference voltage is fixed value, the resistor value of the first resistor is also a fixed value, the average output current of the circuit is constant; the adjustable control voltage changes with the change of the circuit output feedback voltage, thereby ensuring that the switching cycle of the circuit is reduced by the influence of the circuit output feedback voltage, and finally get the adjustable system switching frequency.

The above description is only an overview of the technical of the invention. In order to understand the technical of the invention more clearly and implement it in accordance with the content of the description, the preferred embodiments of the invention are described in detail below with accompanying drawings.

DETAILED DESCRIPTION OF THE INVENTION

The specific embodiments of the invention will be described in further detail below in conjunction with the drawings and embodiments. The following examples are used to illustrate the invention, but not to limit the scope of the invention.

Figure 1:
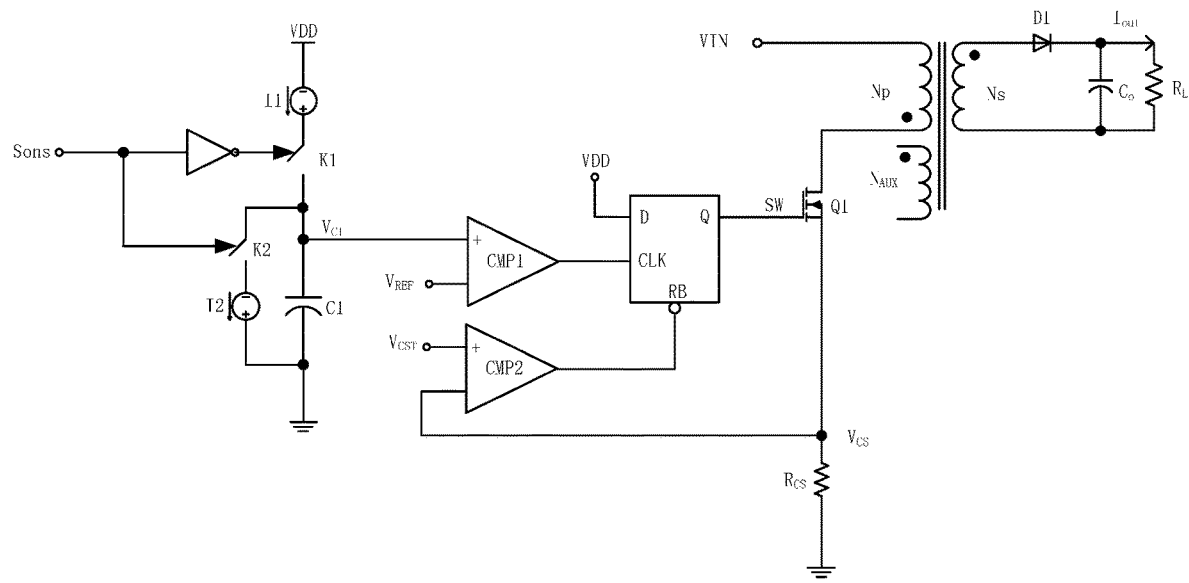
FIG. 1 shows a circuit structure diagram of a flyback AC/DC switching mode power supply in the prior art.
Figure 2:
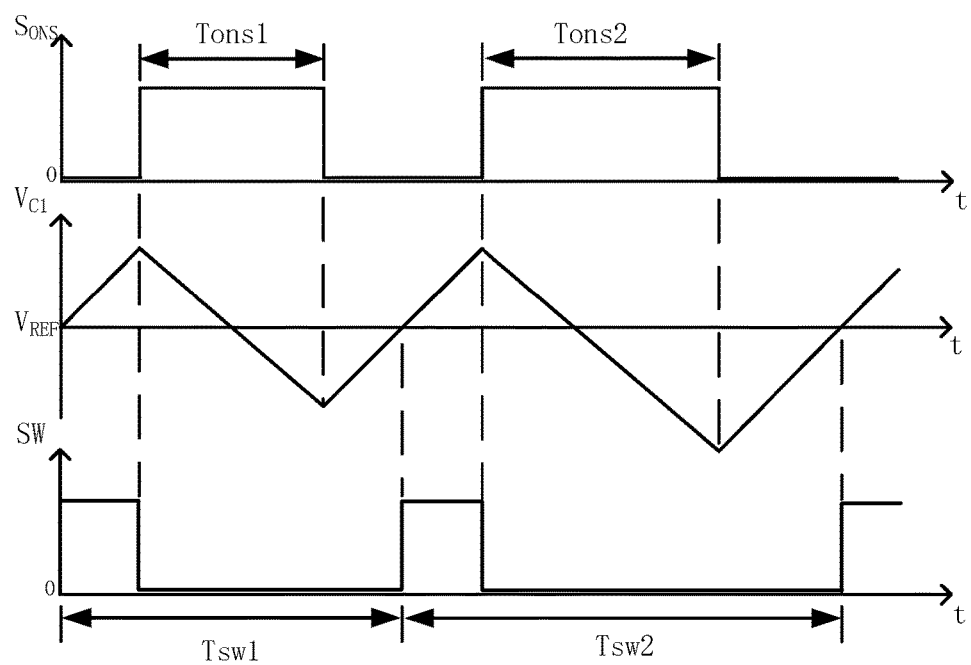
FIG. 2 shows a waveform diagram of partial voltage changes over time in FIG. 1.

Refer to FIG. 1 and FIG. 2, constant-current circuit of the conventional flyback AC/DC switching mode power supply includes a first switch, a second switch, a first capacitor, an inverter, and a standby circuit. The standby circuit includes a first comparator, a second comparator, a control chip, a switch tube, a primary coil current detection resistor, and a primary coil and a secondary coil. The first end of the first switch is connected to the input voltage, and the second end of the first switch connected to the first end of the first capacitor, the first end of the second switch is connected to the first end of the first capacitor, the second end of the second switch is grounded, the second end of the first capacitor is grounded, The non-inverting input end of the first comparator is connected to the first end of the first switch, the inverting input end of the first comparator is connected to the reference voltage $V_{REF}$, and the output end of the first comparator is connected to the clock end of the control chip. The non-inverting input end of the second comparator is connected to the control voltage, the inverting input end of the second comparator is connected to the first end of the primary coil current detection resistor, and the output end of the second comparator is connected to the RB end of the control chip. The trigger of the control chip is connected to the output voltage, the Q end of the control chip is connected to the second output end of the switch tube, the first end of the switch tube is connected to the primary coil, and the first end of the primary coil current detection resistor is connected to the second end of the switch tube. Among them, a output rectifier diode and a third resistor are connected in series with the secondary coil, and the second capacitor is connected to the secondary coil at the same time. The detection signal of the output rectifier diode is reversed by the inverter and then connected to the control ends of the first switch and the second switch. $S_{ons}$ is a real-time signal for detecting whether the output rectifier diode is turned on. When the output rectifier diode is turned on, $S_{ons}=1$; when the output rectifier diode is turned off, $S_{ons}=0$.

The working principle of the constant-current control circuit in the flyback AC/DC switching mode power supply constant-current circuit is: when the D flip-flop outputs a high electrical level, the switch signal SW=1, the switch transistor Q1 is turned on, and the output rectifier diode D1 is turned off, The primary coil flows current and there is no current flowing through the secondary coil. At this time, $S_{ons}=0$, the first switch K1 is on, the second switch K2 is off, the first current I1 starts to charge the first capacitor C1, and the voltage of the first capacitor VC1 rise.

As the current rises, the voltage $V_{CS}$ across the primary coil current detection resistor $R_{CS}$ rises. After a period of time, the voltage $V_{CS}$ of the primary coil current detection resistor reaches the control voltage $V_{CST}$. The control voltage $V_{CST}$ is the voltage of the output voltage and the reference voltage amplified by the error amplifier. The second comparator outputs a low electrical level, the D flip-flop is reset, the switch signal SW=0, the switch transistor Q1 is turned off, the output rectifier diode D1 is turned on, there is no current flowing through the primary coil, and the secondary coil flows current, at this time $S_{ons}=1$, the first switch K1 is off, the second switch K2 is on, the first capacitor C1 is discharged with the second current I2, and $V_{C1}$ drops.

The current flowing through the secondary coil gradually decreases, after the Tons time, the output rectifier diode D1 is turned off. At this time, there is no current flowing through the primary coil and the secondary coil, $S_{ons}=0$, the first switch K1 is on, and the second switch K2 is off, The current I1 starts to charge the first capacitor C1 again. Since conduction time Tons of the output rectifier diode is longer, at this time $V_{C1}$<reference voltage $V_{REF}$, after t3 time, the first current I1 charges the voltage on the first capacitor to the reference voltage $V_{REF}$, and the first comparator outputs a high electrical level, The D flip-flop is triggered and outputs a high electrical level, the switch signal SW=1, the switch transistor Q1 is turned on again, and the control chip enters the second switch cycle. Among them, the waveform of the signal $S_{ons}$, the voltage $V_{C1}$ of the first capacitor changing with time and the periodic waveform of the power switch are shown in FIG. 2.

Because of the average output current formula:

$$I_{out} = \frac{1}{2} \times n \times I_{pk} \times \frac{\text{Tons}}{T_{sw}};$$

Wherein, n is the turns ratio of primary coil and secondary coil of the transformer, $I_{pk}$ is the peak current of the primary coil, Tons is conduction time of the output rectifier diode, and $T_{sw}$ is the power switch cycle.

Then the equation can be found in the above switching cycle:

$$\frac{I1 \times (T_{sw} - T_{ons})}{C1} - \frac{I2 \times T_{ons}}{C1} = 0;$$

From the above equation:

$$\frac{\text{Tons}}{T} = \frac{I1}{I1 + I2},$$

when the first current I1 and the second current I2 satisfy $$\frac{I1}{I1 + I2},$$

it is a fixed value, that is, when $$\frac{\text{Tons}}{T_{sw}}$$

is a fixed value, The output current is constant.

The constant-current output control method in the prior art has great limitations. It requires $$I_{pk} = \frac{V_{CST}}{R_{CS}}$$

to be a fixed value. Under this condition, as shown in FIG. 2, if the circuit output feedback voltage continues to decrease, it will cause conduction time Tons of the output rectifier diode increases, which causes the circuit switching cycle to become longer and the switching frequency to decrease. In the FIG. 2, Tons2>Tons1, in order to ensure that $$\frac{\text{Tons}}{T}$$

is a fixed value, the switching cycle will increase proportionally, that is, Tsw2>Tsw1. If the circuit output feedback voltage is too low, the power switching cycle will be too large, and the switching frequency of the circuit may be will enter the audio range.

Figure 3:
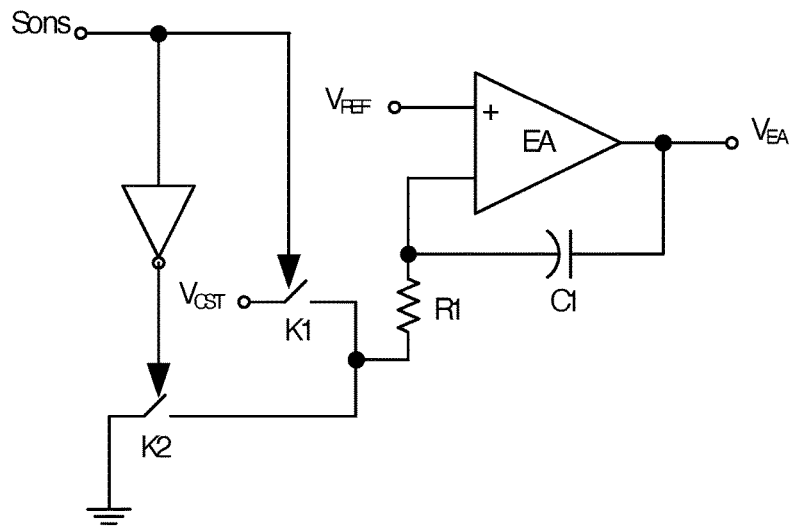
FIG. 3 shows a schematic diagram of the cross-current output control circuit of the invention.

Please refer to FIG. 3 again, in view of the above problems, the invention provides a constant-current output control circuit, the circuit includes a control module, a first resistor, a capacitor, and an error amplifier; the control module is connected to an adjustable control voltage and a detection signal, the non-inverting input end of the error amplifier is connected to the reference voltage, the inverting input end of the error amplifier is connected to the first end of the first resistor, and the output end of the error amplifier is connected to the non-inverting input end of the first comparator of the circuit to be connected. The first end of the capacitor is connected to the first end of the first resistor, and the second end of the capacitor is connected to the output end of the error amplifier. The second end of the first resistor is connected to the control module. Wherein, the control module includes a first switch, a second switch, and an inverter, the first end of the first switch is connected to an adjustable control voltage, and the second end of the first switch is connected to the second end of the first resistor, the first end of the second switch is connected to the ground, the second end of the second switch is connected to the second end of the first switch, and the detection signal is connected to the control end of the first switch, the detection signal is connected to the control end of the second switch after being reversed by the inverter. The adjustable control voltage is the voltage of the circuit output feedback voltage amplified by the error amplifier. In the circuit of the invention, the voltage value of the reference voltage is smaller than the voltage value of the control voltage. The output voltage value of the error amplifier is equal to the sum of the reference voltage and the voltage value of the capacitor. Wherein, $S_{ons}$ is also a real-time signal for detecting whether the output rectifier diode is turned on. When the output rectifier diode is turned on, $S_{ons}=1$; when the output rectifier diode is turned off, $S_{ons}=0$.

The working principle of the constant-current output control circuit of the invention is: when the output rectifier diode is turned off, $S_{ons}=0$, the first switch K1 is off, the second switch K2 is on, and the voltage difference between the two ends of the first resistor R1 $\Delta V_{R1}$=reference voltage $V_{REF}$, and generate a first current flowing to the ground $$I1 = \frac{V_{REF}}{R1},$$

the voltage across the first capacitor C1 rises, the output voltage $V_{EA}$ of the error amplifier rises; when the output rectifier diode is turned on, $S_{ons}=1$, the first switch K1 is on, the second switch K2 is off. Since the reference voltage $V_{REF}$<the control voltage $V_{CST}$, the voltage difference between the two ends of the first resistor R1 $\Delta V_{R1}=V_{CST}-V_{REF}$, and a second current $$I2 = \frac{V_{CST} - V_{REF}}{R1}$$

is generated and flow to the first capacitor C1. the voltage across the first capacitor C1 drops, and the output voltage $V_{EA}$ of the error amplifier drops. Wherein, conduction time Tons of the output rectifier diode satisfies:

$$I1 \times (T_{sw} - \text{Tons}) = I2 \times \text{Tons};$$

That is:

$$\frac{V_{REF}}{R1} \times (T_{sw} - \text{Tons}) = \frac{V_{CST} - V_{REF}}{R1} \times \text{Tons},$$

wherein, $T_{sw}$ is the switching cycle of the control chip, from this formula, we can get:

$$V_{REF} = V_{CST} \times \frac{\text{Tons}}{T_{sw}};$$

When the turns ratio of primary coil and secondary coil (n), the primary coil current detection resistor $R_{CS}$, and $$V_{CST} \times \frac{Tons}{T_{sw}}$$

are all fixed values, the output current is constant.

Because the adjustable control voltage is adjustable with the output feedback voltage of the circuit, the influence of the switching cycle of the power supply with the output feedback voltage of the circuit is reduced, thereby ensuring that the switching frequency of the circuit is adjustable.

Figure 4:
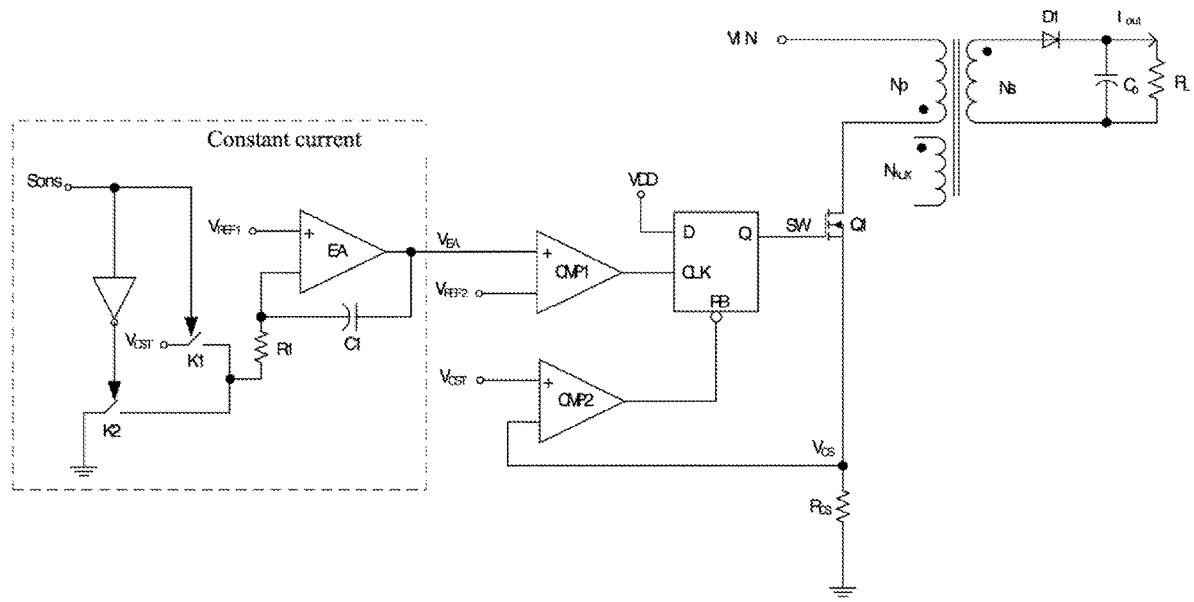
FIG. 4 shows a circuit structure diagram of a flyback AC/DC switching mode power supply of the invention.
Figure 5:
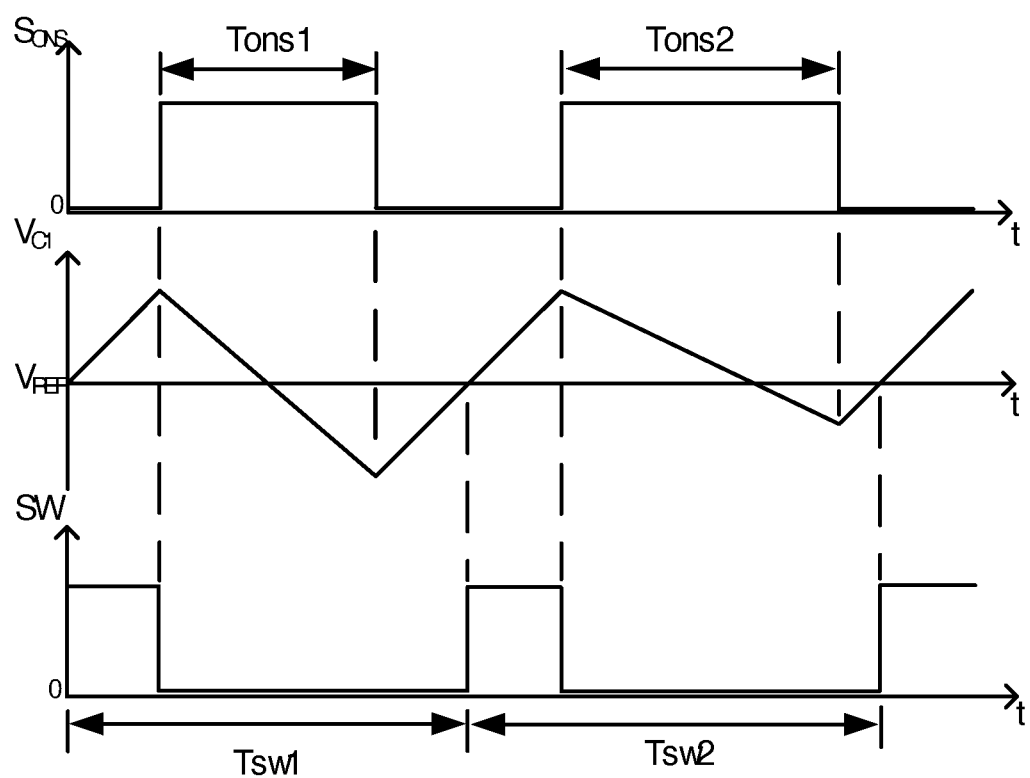
FIG. 5 shows a waveform diagram of partial voltage changes over time in FIG. 4.

Please refer to FIG. 4 and FIG. 5, the constant-current output control circuit of the invention is connected to the flyback AC/DC switching mode power supply constant-current circuit, in other words, the output end of the error amplifier is connected to the non-inverting input end of the first comparator. The working principle of the circuit is: when the D flip-flop outputs a high electrical level, the switch signal SW=1, the switch transistor Q1 is turned on, the primary coil flows current and there is no current flowing through secondary coil, the output rectifier diode D1 is turned off, $S_{ons}$=0, The first switch K1 is off, and the second switch K2 is on. The first current $$I1 = \frac{V_{REF}}{R1}$$

flowing to the ground is generated on the first resistor R1. The voltage across the first capacitor C1 rises, and the voltage $V_{EA}$ of the error amplifier rises.

As the primary coil current rises, the voltage $V_{CS}$ across the primary coil current detection resistor $R_{CS}$ rises. After a period of time, $V_{CS}$ reaches the control voltage $V_{CST}$, the second comparator outputs a low electrical level, the D flip-flop is reset, and the switch signal SW=0, switch transistor Q1 is turned off, the output rectifier diode D1 is turned on, there is no current flowing through the primary coil, and the secondary coil flows current, at this time $S_{Tons}$=1, the first switch K1 is off, and the second switch K2 is on. Since $V_{CST}$>$V_{REF}$, the second current $$I2 = \frac{V_{CST} - V_{REF}}{R1}$$

flowing to the first capacitor C1 is generated on the resistor R1, the voltage across the first capacitor C1 drops, and the output voltage $V_{EA}$ of the error amplifier drops.

The current flowing through the secondary coil gradually decreases. After the Tons time, the output rectifier diode D1 is turned off. At this time, there is no current flowing through the primary coil and the secondary coil, $S_{ons}$=0, the first switch K1 is on, and the second switch K2 is off, A current I1 flowing to the ground is generated on the first resistor R1, the voltage across the first capacitor C1 rises, and $V_{EA}$ rises. Because Tons is longer, at this time, $V_{EA}$<$V_{REF}$, after a period of time, the current I1 will charge the output voltage of the error amplifier to $V_{EA}$=$V_{REF}$, the first comparator outputs a high electrical level, the D flip-flop is triggered, and output high electrical level, the switch signal SW=1, the switch transistor Q1 is turned on again, and the control chip enters the second switch cycle.

The equation can be found in the above switching cycle:

$$\frac{I1 \times (T_{sw} - T_{ons})}{C1} - \frac{I2 \times T_{ons}}{C1} = 0;$$

We can get:

$$V_{REF} = V_{CST} \times \frac{Tons}{T_{sw}};$$

Wherein, Tsw is the power switch cycle

When the circuit output feedback voltage decreases, as shown in FIG. 5, it will cause conduction time Tons of the output rectifier diode to increase, Tons2>Tons1; at this time, the adjustable control voltage decreases with the decrease of the output voltage, which can get a reduced second current $$I2 = \frac{V_{CST} - V_{REF}}{R1},$$

thereby reducing the time for the first current $$I1 = \frac{V_{REF}}{R1}$$

to charge the first capacitor, effectively avoiding the output voltage being too low and causing the power switch cycle to be too large, the power switching frequency is adjustable.

The invention also provides a method for designing a constant-current output control circuit, using the constant-current output control circuit as described above, and the method includes the following steps:

When the detection signal is low electrical level, the first switch is off and the second switch is on, so that the first resistor generates a first current flowing to the ground, the voltage across the capacitor rises, and the voltage value of the output end of the error amplifier increases;

When the detection signal is high electrical level, the first switch is on and the second switch is off, so that the circuit generates a second current flowing to the capacitor, the voltage across the capacitor drops, and the voltage value of the output end of the error amplifier decreases.

To sum up: the invention provides a constant-current output control circuit and its design method. The control circuit and method connect a reference voltage at the non-inverting input end of the error amplifier and connect an adjustable control voltage at its inverting input end. Because the access time of the adjustable control voltage is related to the high electrical level time of the detection signal, the ratio of the product of the adjustable control voltage and the high electrical level time of the detection signal to the power switch cycle is the reference voltage; because the reference voltage is fixed value, the resistor value of the first resistor is also a fixed value, the average output current of the circuit is constant; the adjustable control voltage changes with the change of the circuit output feedback voltage, thereby ensuring that the switching cycle of the circuit is reduced by the influence of the circuit output feedback voltage, and finally get the adjustable system switching frequency.

The technical features of the above-mentioned embodiments can be combined arbitrarily. In order to make the description concise, all possible combinations of the various technical features in the above-mentioned embodiments are not described. However, as long as there is no contradiction in the combination of these technical features, all should be considered as the scope of this specification.

The above-mentioned embodiments only express several implementation modes of the invention, and the description is relatively specific and detailed, but it should not be understood as a limitation on the scope of the invention. It should be pointed out that for those of ordinary skill in the art, without departing from the concept of the invention, several modifications and improvements can be made, and these all fall within the protection scope of the invention. Therefore, the protection scope of the patent of the invention should be subject to the appended claims.

The invention claimed is:

1. A method for designing a constant-current output control circuit, using a constant-current output control circuit, the method comprising the following steps: when a detection signal is low electrical level, a first switch is off and a second switch is on, so that a first resistor generates a first current flowing to ground, a voltage across a capacitor rises, and a voltage value of an output end of an error amplifier increases; when the detection signal is high electrical level, the first switch is on and the second switch is off, so that the constant current output control circuit generates a second current flowing to the capacitor, the voltage across the capacitor drops, and the voltage value of the output end of the error amplifier decreases, wherein the second current flowing to the capacitor generated by the constant current output control circuit is specifically: a voltage value of a reference voltage is less than an adjustable control voltage value, a voltage difference between the two ends of the first resistor is $\Delta V_{R1}=V_{CST}-V_{REF}$, and the second current flowing to the capacitor is generated on the first resistor to discharge the capacitor, the second current is:

$$I_2 = \frac{V_{CST} - V_{RE}}{D1}$$

wherein, $V_{CST}$ is an adjustable control voltage; and wherein the constant-current output control circuit, includes a control module, the first resistor, the capacitor, and the error amplifier; the control module is connected to the adjustable control voltage and the detection signal, and a non-inverting input end of the error amplifier is connected to the reference voltage, an inverting input end of the error amplifier is connected to a first end of the first resistor, the output end of the error amplifier is connected to the constant current output control circuit, and a first end of the capacitor is connected to the first end of the first resistor, a second end of the capacitor is connected to the output end of the error amplifier, and a second end of the first resistor is connected to the control module.

2. The method of claim 1, wherein the control module includes the first switch, the second switch and an inverter, and a first end of the first switch is connected to the adjustable control voltage, a second end of the first switch is connected to the second end of the first resistor, a first end of the second switch is grounded, and a second end of the second switch is connected to the second end of the first switch, the detection signal is connected to a control end of the first switch, and the detection signal is connected to a control end of the second switch after being reversed by the inverter.

3. The method of claim 2, wherein the adjustable control voltage is a voltage of a circuit output feedback voltage amplified by the error amplifier.

4. The method of claim 3, wherein when the circuit output feedback voltage changes, the adjustable control voltage changes; when the adjustable control voltage changes, a switching frequency of the constant current output control circuit changes.

5. The method according to claim 1, wherein a voltage value of the reference voltage is smaller than the voltage value of the adjustable control voltage.

6. The method according to claim 1, wherein an output voltage value of the error amplifier is equal to the sum of the reference voltage and a voltage value of the capacitor.

7. The method according to claim 1, wherein the first current flowing to the ground generated by the first resistor is specifically:

a voltage difference between the two ends of the first resistor is $\Delta V_{R1}=V_{REF}$, and when the first current flowing to the ground is generated, the capacitor is charged, the first current is:

$$I_2 = \frac{V_{CST} - V_{REF}}{R1};$$

wherein, $V_{REF}$ is the reference voltage, and $R_1$ is a first resistor value.

8. The method according to claim 1, wherein the relationship among the reference voltage, $V_{CST}$, Tons and $T_{sw}$ is:

$$V_{REF} = V_{CST} \times \frac{Tons}{T_{sw}};$$

wherein, Tons is a high electrical level time of the detection signal, and $T_{sw}$ is a period.

* * * * *